(12) United States Patent
Lee et al.

(10) Patent No.: US 10,424,355 B2
(45) Date of Patent: Sep. 24, 2019

(54) SEMICONDUCTOR INTEGRATED CIRCUIT INCLUDING MASTER CHIP AND SLAVE CHIP THAT ARE STACKED

(71) Applicant: SK hynix Inc., Gyeonggi-do (KR)

(72) Inventors: Dong-Uk Lee, Gyeonggi-do (KR);
Young-Ju Kim, Gyeonggi-do (KR);
Keun-Soo Song, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 72 days.

(21) Appl. No.: 15/678,662

(22) Filed: Aug. 16, 2017

(65) Prior Publication Data

US 2017/0365312 A1 Dec. 21, 2017

Related U.S. Application Data

(62) Division of application No. 15/004,060, filed on Jan. 22, 2016, now Pat. No. 9,773,535, which is a division
(Continued)

(30) Foreign Application Priority Data

Jun. 29, 2012 (KR) ........................ 10-2012-0071270

(51) Int. Cl.
*G11C 7/22* (2006.01)
*G11C 8/18* (2006.01)
(Continued)

(52) U.S. Cl.
CPC ................ *G11C 7/222* (2013.01); *G11C 7/10* (2013.01); *G11C 7/1012* (2013.01);
(Continued)

(58) Field of Classification Search
CPC ..... G11C 7/222; G11C 7/1081; G11C 7/1054; G11C 7/12; G11C 7/1012; G11C 7/1042;
(Continued)

(56) References Cited

U.S. PATENT DOCUMENTS 6,208,575 B1 3/2001 Proebsting
6,356,485 B1 3/2002 Proebsting
(Continued)

FOREIGN PATENT DOCUMENTS

JP 2006277870 10/2006
JP 2011081882 4/2011

OTHER PUBLICATIONS

Office Action issued by the Korean Intellectual Property Office dated Nov. 8, 2018.
(Continued)

*Primary Examiner* — David Lam
(74) *Attorney, Agent, or Firm* — IP & T Group LLP

(57) ABSTRACT

A semiconductor integrated circuit including first semiconductor chip and second semiconductor chip that are vertically stacked, wherein the first semiconductor chip includes a first column data driving circuit configured to transmit internal data to the second semiconductor chip in a DDR (double data rate) scheme based on an internal strobe signal, and a first column strobe signal driving circuit configured to generate first column strobe signals that are source-synchronized with first column data transmitted to the second semiconductor chip by the first column data driving circuit, based on the internal strobe signal, and transmit the first column strobe signals to the second semiconductor chip.

17 Claims, 8 Drawing Sheets

Related U.S. Application Data of application No. 13/719,096, filed on Dec. 18, 2012, now Pat. No. 9,275,703.

(51) Int. Cl.
  *G11C 7/10* (2006.01)
  *G11C 7/12* (2006.01)

(52) U.S. Cl.
  CPC .......... *G11C 7/1039* (2013.01); *G11C 7/1042* (2013.01); *G11C 7/1054* (2013.01); *G11C 7/1081* (2013.01); *G11C 7/12* (2013.01); *G11C 7/22* (2013.01); *G11C 8/18* (2013.01); *G11C 2207/107* (2013.01)

(58) Field of Classification Search
  CPC .......... G11C 7/1039; G11C 8/18; G11C 7/22; G11C 7/10; G11C 2207/107
  See application file for complete search history.

(56) References Cited

U.S. PATENT DOCUMENTS

| | | | |
|---|---|---|---|
| 8,009,490 B2 * | 8/2011 | Chae | G11C 7/1039 365/193 |
| 2014/0003168 A1 | 1/2014 | Lee et al. | |

OTHER PUBLICATIONS

Notice of Allowance issued by the USPTO Patent Office dated Nov. 29, 2018 for the U.S. Appl. No. 15/678,634.

* cited by examiner

SEMICONDUCTOR INTEGRATED CIRCUIT INCLUDING MASTER CHIP AND SLAVE CHIP THAT ARE STACKED

CROSS-REFERENCE TO RELATED APPLICATION

This application is a division of U.S. patent application Ser. No. 15/004,060 filed on Jan. 22, 2016, now U.S. Pat. No. 9,275,703, which is a division of U.S. patent application Ser. No. 13/719,096 filed on Dec. 18, 2012, now U.S. Pat. No. 9,275,703 issued on Mar. 1, 2016, which claims priority of Korean Patent Application No. 10-2012-0071270, filed on Jun. 29, 2012. The disclosure of each of the foregoing applications is incorporated herein by reference in its entirety.

BACKGROUND

1. Field

Exemplary embodiments of the present invention relate to a semiconductor design technology, and more particularly, to a semiconductor integrated circuit with a stack package structure.

2. Description of the Related Art

In general, packaging technologies for semiconductor integrated circuits have continuously been developed to satisfy the demand toward reducing size and mounting reliability. Recently, as reduction in size and high performance are demanded in electric and electronic products, various techniques for stack packages have been developed.

The term "stack" that is referred to in the semiconductor industry means to vertically pile at least two semiconductor chips or semiconductor packages. For example, in the case of a semiconductor memory device, by using a stack package, a product with memory capacity at least two times greater than that obtainable without a stack package may be realized. Since the stack package provides advantages in terms of not only memory capacity but also mounting density and mounting area utilization efficiency, research and development for the stack package have been accelerated.

Generally, a stack package may be fabricated through a method in which individual semiconductor chips are stacked and then the stacked semiconductor chips are packaged at once or a method in which individually packaged semiconductor chips are stacked. The individual semiconductor chips of the stack package are electrically connected through metal wires or through-chip vias. Specifically, a stack package using through-chip vias has a structure in which through-chip vias are formed in the individual semiconductor chip such that physical and electrical connections between the semiconductor chips are formed by the through-chip vias.

FIG. 1 is a perspective view for illustrating a semiconductor integrated circuit in which electrical connections are formed through through-chip vias.

Referring to FIG. 1, a semiconductor integrated circuit 100 includes a first semiconductor chip 101 which is electrically connected with an external controller (not shown), second to fifth semiconductor chips 103, 105, 107 and 109 that are vertically stacked on the first semiconductor chip 101, and a plurality of first to fourth through-chip vias 113, 115, 117 and 119 that vertically pass through the second to fifth semiconductor chips 103, 105, 107 and 109.

The first semiconductor chip 101 is configured to control the second to fifth semiconductor chips 103, 105, 107 and 109 through the first to fourth through-chip vias 113, 115, 117 and 119 based on various signals and power provided from the external controller, and is generally referred to as a master chip.

The second to fifth semiconductor chips 103, 105, 107 and 109 are semiconductor chips for performing given operations under the control of the first semiconductor chip 101, and are generally referred to as slave chips.

The first to fourth through-chip vias 113, 115, 117 and 119 are formed of a metal with high conductivity, and are generally referred to as through-silicon vias (TSVs).

According to the semiconductor integrated circuit 100, as the various signals and power are interfaced through the first to fourth through-chip vias 113, 115, 117 and 119, advantages are provided in that signal delay and current consumption may be decreased and operation performance may be improved due to improved I/O bandwidth.

However, the semiconductor integrated circuit 100 configured as mentioned above has the following concerns.

While it is illustrated in FIG. 1 that the respective semiconductor chips 103, 105, 107 and 109 have two through-chip vias 113, 115, 117 and 119, each of the semiconductor chips 103, 105, 107 and 109 actually has several hundreds to several thousands of through-chip vias therein. Since the through-chip vias vertically pass through the semiconductor chips, the more the numbers of the through-chip vias increase, the more the areas occupied by the through-chip vias increase. Thus, the areas of the semiconductor chips increase as well. In order to reduce the areas, the numbers of the through-chip vias should be decreased, so that limitations exist in improving bandwidth.

As mentioned above, the various signals and power are interfaced between the stacked semiconductor chips. In particular, in the case where multi-bits data is interfaced, operation performance may be adversely influenced by a skew that inevitably occurs due to a characteristic of interfacing.

SUMMARY

Exemplary embodiments of the present invention are directed to a semiconductor integrated circuit that may minimize an area and improve I/O bandwidth.

Other embodiments of the present invention are directed to a semiconductor integrated circuit that may improve interface performance between semiconductor chips.

In accordance with an embodiment of the present invention, a semiconductor integrated circuit including first semiconductor chip and second semiconductor chip that are vertically stacked, wherein the first semiconductor chip includes a first column data driving circuit configured to transmit internal data to the second semiconductor chip in a DDR (double data rate) scheme based on an internal strobe signal, and a first column strobe signal driving circuit configured to generate first column strobe signals that are source-synchronized with first column data transmitted to the second semiconductor chip by the first column data driving circuit, based on the internal strobe signal, and transmit the first column strobe signals to the second semiconductor chip.

In accordance with another embodiment of the present invention, a semiconductor integrated circuit includes at least one master chip and at least one slave chip that are stacked, wherein the master chip is configured to transmit write data inputted from an outside, to the slave chip in a DDR scheme based on a first internal strobe signal, transmit write strobe signals that are source-synchronized with the write data transmitted in the DDR scheme, to the slave chip based on the first internal strobe signal, and receive and output to the outside read data transmitted from the slave chip, based on read strobe signals which are source-synchronized with the read data and are provided from the slave chip, and the slave chip being configured to transmit the read data provided from an inside thereof, to the master chip in the DDR scheme based on a second internal strobe signal, transmit the read strobe signals to the master chip based on the second internal strobe signal, and store therein the write data transmitted from the master chip, based on the write strobe signals.

In accordance with yet another embodiment of the present invention, a semiconductor integrated circuit includes first and second semiconductor chips that are vertically stacked, wherein the first semiconductor chip includes a plurality of column data driving circuit configured to receive a plurality of first column data transmitted in a DDR scheme from the second semiconductor chip, based on an alignment strobe signal, and load the plurality of first column data on a plurality of data input/output lines, and an alignment strobe signal driving circuit configured to delay a column strobe signal transmitted from the second semiconductor chip that is source-synchronized with the first column data, by a given delay time, and generate the alignment strobe signal.

In accordance with still another embodiment of the present invention, a semiconductor integrated circuit includes at least one master chip and at least one slave chip which are stacked, wherein the master chip is configured to transmit write data inputted from an outside and differential write strobe signals source-synchronized with the write data, to the slave chip based on a first internal strobe signal, and receive and output to the outside read data transmitted from the slave chip, based on first differential alignment strobe signals which are provided from the slave chip and are generated by delaying differential read strobe signals source-synchronized with the read data, by a given delay time, and the slave chip is configured to transmit the read data provided from an inside thereof and the differential read strobe signals, to the master chip in based on a second internal strobe signal, and store therein the write data transmitted from the master chip, based on second differential alignment strobe signals which are generated by delaying the differential write strobe signals by the given delay time.

In the above embodiments, since a DDR (double data rate) scheme is used when data is interfaced between the stacked semiconductor chips, bandwidth may be improved. Also, as the bandwidth is improved, the number of through-chip vias may be decreased and space may be saved.

Furthermore, since a strobe signal source-synchronized with data is also transmitted when the data is interfaced between the stacked semiconductor chips, the reliability of the data may be enhanced. In particular, when receiving the strobe signal source-synchronized with the data, because a delay operation for internally securing the setup/hold time of the data is performed, the reliability of the data may be ensured. As a consequence, operation performance may be improved when the data is interfaced between the stacked semiconductor chips.

DETAILED DESCRIPTION

Figure 1:
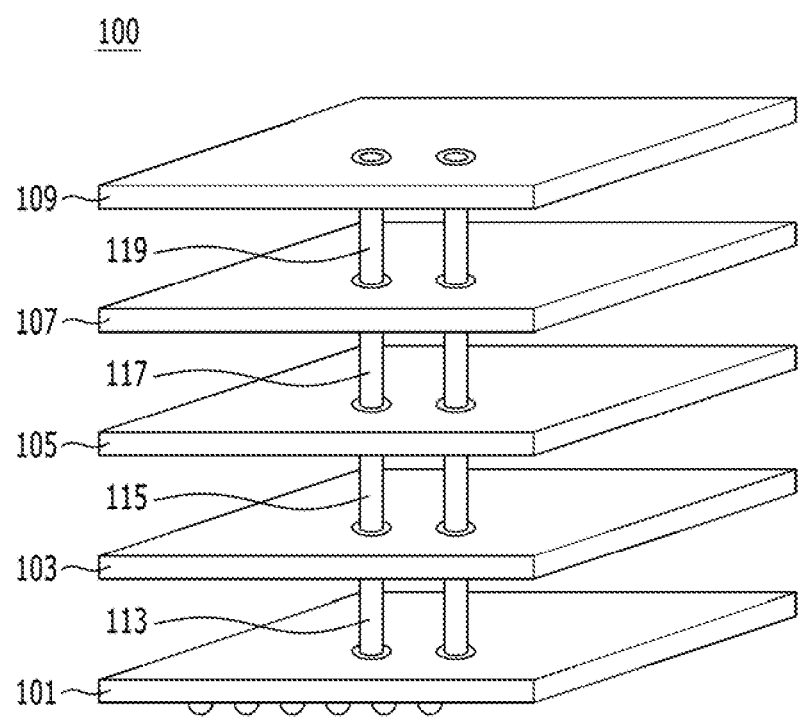
FIG. 1 is a perspective view for illustrating a conventional semiconductor integrated circuit with a stack package structure.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

A semiconductor integrated circuit in accordance with an embodiment of the present invention has a stack package structure, and separate descriptions thereof will be omitted herein for the sake of convenience in explanation (see FIG. 1).

Figure 2:
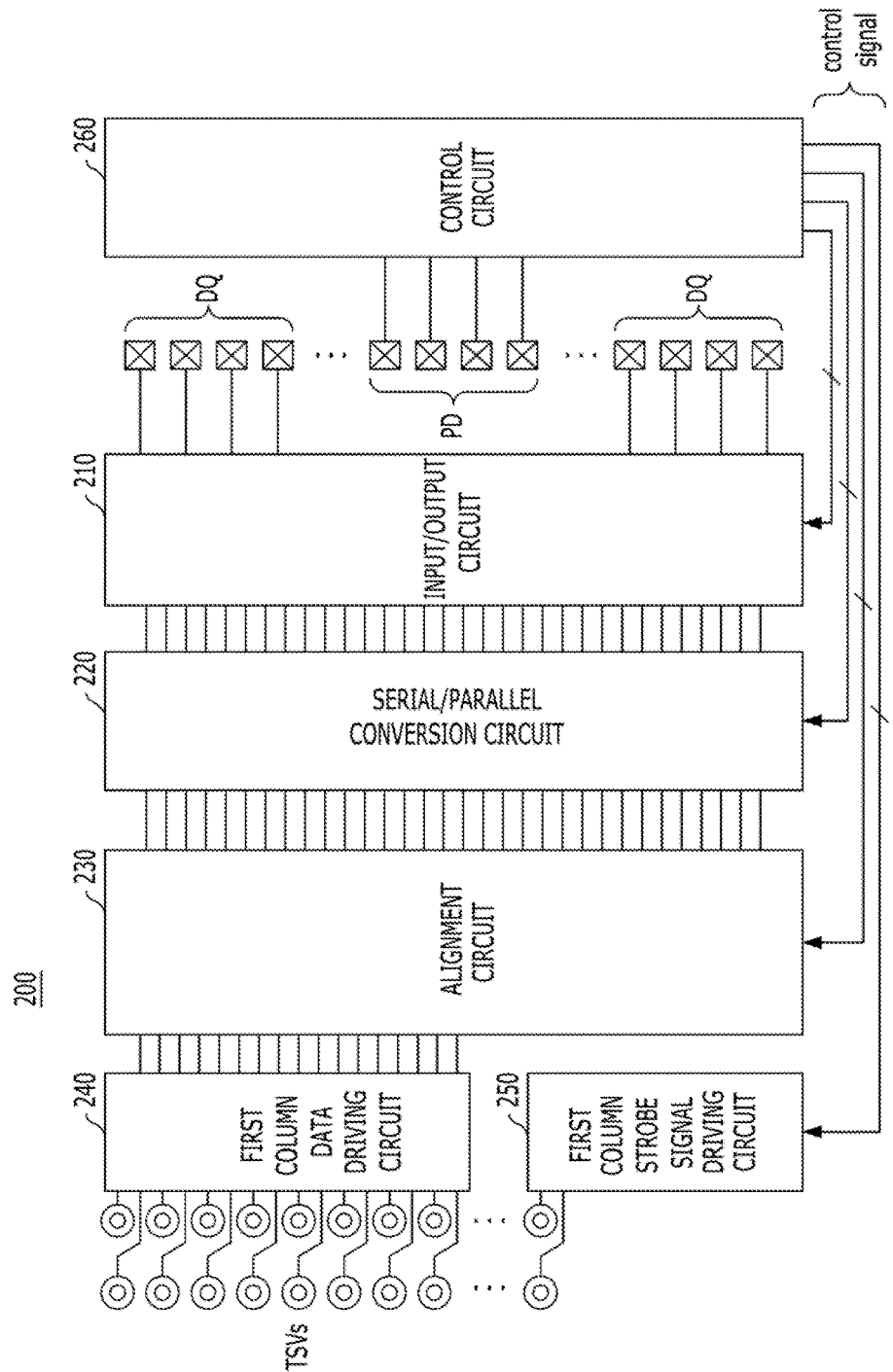
FIG. 2 is a block diagram illustrating a master chip included in a semiconductor integrated circuit in accordance with an embodiment of the present invention.

FIG. 2 is a block configuration diagram illustrating a master chip included in a semiconductor integrated circuit in accordance with an embodiment of the present invention.

Referring to FIG. 2, a master chip 200 includes an input/output circuit 210 configured to transmit and receive column data to and from data pads DQ, a serial/parallel conversion circuit 220 configured to transmit and receive column data to and from the input/output circuit 210, an alignment circuit 230 configured to transmit and receive column data to and from the serial/parallel conversion circuit 220, a first column data driving circuit 240 configured to transmit and receive column data between the alignment circuit 230 and through-chip vias (TSVs) of a slave chip, a first column strobe signal driving circuit 250 configured to transmit and receive a column strobe signal source-synchronized with the column data transmitted between the first column data driving circuit 240 and the TSVs of the slave chip, to and from the corresponding TSV of the slave chip, and a control circuit 260 configured to generate control signals for controlling the input/output circuit 210, the serial/parallel conversion circuit 220, the alignment circuit 230, the first column data driving circuit 240 and the first column strobe signal driving circuit 250, in response to external commands inputted through command pads PD.

Figure 3:
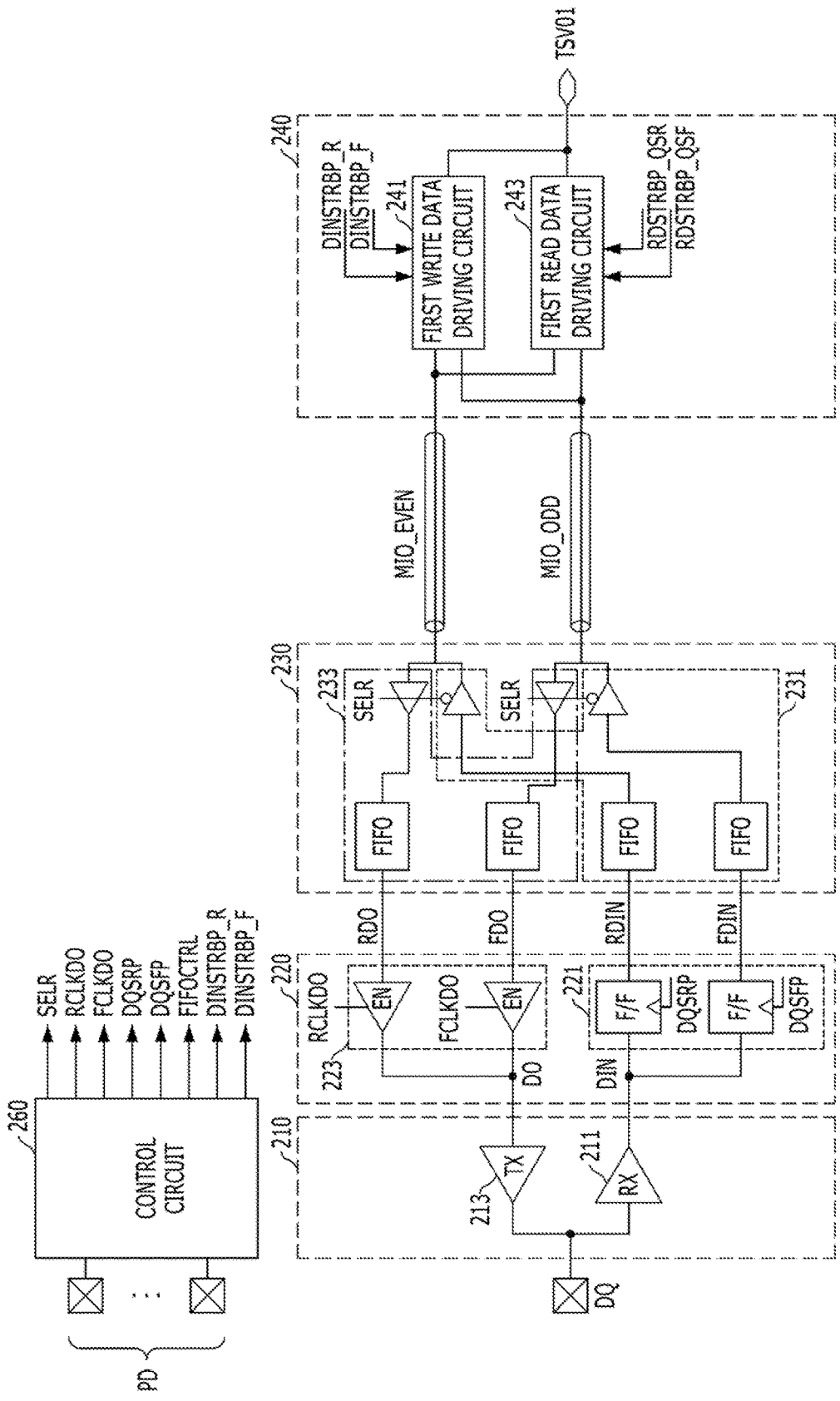
FIG. 3 is a detailed diagram illustrating the data path of the master chip shown in FIG. 2.

FIG. 3 is a detailed diagram illustrating the input/output circuit 210, the serial/parallel conversion circuit 220, the alignment circuit 230 and the first column data driving circuit 240, of the master chip 200 shown in FIG. 2.

In the embodiment of the present invention, for the sake of convenience in explanation, only the data path corresponding to one data pad DQ will be described.

Referring to FIG. 3, the input/output circuit 210 includes an input buffer unit 211 configured to buffer write data applied from the external controller through the data pad DQ, and an output buffer unit 213 configured to output read data DO serially transmitted from the serial/parallel conversion circuit 220, to the data pad DQ.

The serial/parallel conversion circuit 220 includes a parallel conversion unit 221 configured to output write data DIN in parallel, which is buffered through the input buffer unit 211, to the alignment circuit 230 in response to data strobe signals DQSRP and DQSFP, and a serial conversion unit 223 configured to serially output read data RDO and FDO simultaneously transmitted from the alignment circuit 230, to the output buffer unit 213 in response to clock signals RCLKDO and FCLKDO.

The alignment circuit 230 includes a write register unit 231 configured to simultaneously output write data RDIN and FDIN parallel transmitted from the parallel conversion unit 221, to a pair of middle input/output lines MIO_EVEN and MIO_ODD in response to an input/output select signal SELR, and a read register unit 233 configured to simultaneously output the read data transmitted through the pair of middle input/output lines MIO_EVEN and MIO_ODD, to the serial conversion unit 223 in response to the input/output select signal SELR.

The first column data driving circuit 240 includes a first write data driving circuit 241 configured to transmit the write data transmitted through the pair of middle input/output lines MIO_EVEN and MIO_ODD, to a first through-chip via TSV01 of the slave chip in a DDR (double data rate) scheme in response to a first internal rising strobe signal DINSTRBP_R and a first internal falling strobe signal DINSTRBP_F, and a first read data driving circuit 243 configured to transmit the read data transmitted from the first through-chip via TSV01 of the slave chip in the DDR scheme, to the pair of middle input/output lines MIO_EVEN and MIO_ODD in response to first differential alignment strobe signals RDSTRBP_QSR and RDSTRBP_QSF.

Figure 4:
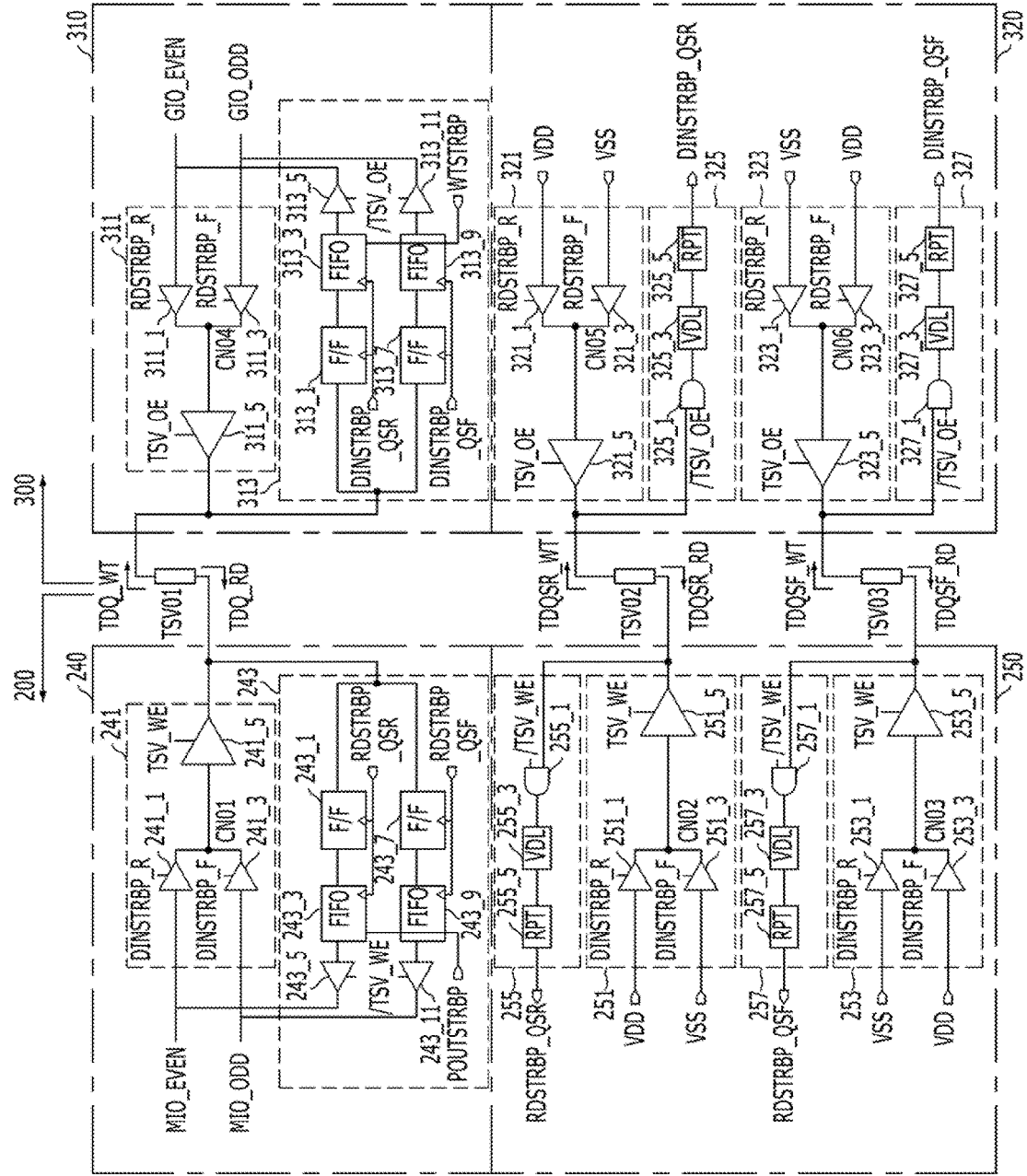
FIG. 4 is a block configuration diagram for illustrating an interface relationship between a slave chip and the master chip included in the semiconductor integrated circuit in accordance with the embodiment of the present invention.

FIG. 4 is a block configuration diagram for illustrating an interface relationship between the slave chip 300 and the master chip 200 included in the semiconductor integrated circuit in accordance with the embodiment of the present invention.

Referring to FIG. 4, the master chip 200 includes the first column data driving circuit 240 that includes the first write data driving circuit 241 and the first read data driving circuit 243 described above, and the first column strobe signal driving circuit 250 that includes differential write strobe signal driving circuits 251 and 253 and first differential alignment strobe signal driving circuits 255 and 257. The slave chip 300 includes a second column data driving circuit 310 having a configuration corresponding to the first column data driving circuit 240, and a second column strobe signal driving circuit 320 having a configuration corresponding to the first column strobe signal driving circuit 250. The first and second column data driving circuits 240 and 310 are electrically connected by the medium of the first through-chip via TSV01, the rising write strobe signal driving circuit 251 and the first rising alignment strobe signal driving circuit 255 are electrically connected with a rising read strobe signal driving circuit 321 and a second rising alignment strobe signal driving circuit 325 by the medium of a second through-chip via TSV02, and the falling write strobe signal driving circuit 253 and the first falling alignment strobe signal driving circuit 257 are electrically connected with a falling read strobe signal driving circuit 323 and a second falling alignment strobe signal driving circuit 327 by the medium of a third through-chip via TSV03. Meanwhile, the first to third through-chip vias TSV01 to TSV03 are formed to vertically pass through the master chip 200 or the slave chip 300 based on the stack positions of the master chip 200 and the slave chip 300. For example, in the case where the semiconductor integrated circuit has a structure in which the slave chip 300 is stacked on the master chip 200, the first to third through-chip vias TSV01, TSV02 and TSV03 are formed to pass through the slave chip 300.

First, the respective components of the master chip 200 will be described in detail.

The first write data driving circuit 241 includes a first write data driving unit 241_1 configured to output the write data transmitted through one middle input/output line MIO_EVEN of the pair of middle input/output lines MIO_EVEN and MIO_ODD, to a first connection node CN01 in response to the first internal rising strobe signal DINSTRBP_R, a second write data driving unit 241_3 configured to output the write data transmitted through the other middle input/output line MIO_ODD of the pair of middle input/output lines MIO_EVEN and MIO_ODD, to the first connection node CN01 in response to the first internal falling strobe signal DINSTRBP_F, and a third write data driving unit 241_5 configured to transmit the write data outputted through the first connection node CN01, to the first through-chip via TSV01 in response to a write enable signal TSV_WE.

The first read data driving circuit 243 includes a first read data latch unit 243_1 configured to latch read data TDQ_RD transmitted from the first through-chip via TSV01 in the DDR scheme, in response to the first rising alignment strobe signal RDSTRBP_QSR, a first read data storage unit 243_3 configured to store the read data latched by the first read data latch unit 243_1, in response to the first rising alignment strobe signal RDSTRBP_QSR and output the stored read data in response to an internal read strobe signal POUTSTRBP, a first read data driving unit 243_5 configured to output the read data stored in the first read data storage unit 243_3, to the corresponding middle input/output line MIO_EVEN in response to an inverted write enable signal /TSV_WE, a second read data latch unit 243_7 configured to latch the read data TDQ_RD transmitted from the first through-chip via TSV01, in response to the first falling alignment strobe signal RDSTRBP_QSF, a second read data storage unit 243_9 configured to store the read data latched by the second read data latch unit 243_7, in response to the first falling alignment strobe signal RDSTRBP_QSF and output the stored read data in response to the internal read strobe signal POUTSTRBP, and a second read data driving unit 243_11 configured to output the read data stored in the second read data storage unit 243_9, to the corresponding middle input/output line MIO_ODD in response to the inverted write enable signal /TSV_WE. Here, the first and second read data latch unit 243_1 and 243_7 may be realized by a flip-flop circuit, and the first and second read data storage unit 243_3 and 243_9 may be realized by a first-in-first-out (FIFO) circuit.

The rising write strobe signal driving circuit 251 includes a first rising write strobe signal driving unit 251_1 configured to output a high voltage VDD to a second connection node CN02 in response to the first internal rising strobe signal DINSTRBP_R, a second rising write strobe signal driving unit 251_3 configured to output a low voltage VSS to the second connection node CN02 in response to the first internal falling strobe signal DINSTRBP_F, and a third rising write strobe signal driving unit 251_5 configured to transmit the rising write strobe signal outputted through the second connection node CN02, to the second through-chip via TSV02 in response to the write enable signal TSV_WE.

The falling write strobe signal driving circuit 253 includes a first falling write strobe signal driving unit 253_1 configured to output the low voltage VSS to a third connection node CN03 in response to the first internal rising strobe signal DINSTRBP_R, a second falling write strobe signal driving unit 253_3 configured to output the high voltage VDD to the third connection node CN03 in response to the first internal falling strobe signal DINSTRBP_F, and a third falling write strobe signal driving unit 253_5 configured to transmit the falling write strobe signal outputted through the third connection node CN03, to the third through-chip via TSV03 in response to the write enable signal TSV_WE.

The first rising alignment strobe signal driving circuit 255 includes a first input unit 255_1 configured to receive a rising read strobe signal TDQSR_RD transmitted through the second through-chip via TSV02, in response to the inverted write enable signal /TSV_WE, a first delay unit 255_3 configured to delay the rising read strobe signal outputted from the first input unit 255_1, by a given delay time and output a resulting signal, and a first repeater 255_5 configured to output the output signal of the first delay unit 255_3 as the first rising alignment strobe signal RDSTRBP_QSR with a given driving force.

The first falling alignment strobe signal driving circuit 257 includes a second input unit 257_1 configured to receive a falling read strobe signal TDQSF_RD transmitted through the third through-chip via TSV03, in response to the inverted write enable signal /TSV_WE, a second delay unit 257_3 configured to delay the falling read strobe signal outputted from the second input unit 257_1, by the given delay time and output a resulting signal, and a second repeater 257_5 configured to output the output signal of the second delay unit 257_3 as the first falling alignment strobe signal RDSTRBP_QSF with the given driving force. Here, the first and second input unit 255_1 and 257_1 may be realized by an AND logic, and the first and second delay unit 255_3 and 257_3 may be realized by a variable delay line (VDL).

Next, the respective components of the slave chip 300 will be described in detail. As described above, the slave chip 300 is configured in correspondence to the first write data driving circuit 241, the first read data driving circuit 243, the rising write strobe signal driving circuit 251, the falling write strobe signal driving circuit 253, the first rising alignment strobe signal driving circuit 255, and the first falling alignment strobe signal driving circuit 257 of the master chip 200.

A second read data driving circuit 311 includes a first read data driving unit 311_1 configured to output the read data transmitted through one global input/output line GIO_EVEN of a pair of global input/output lines GIO_EVEN and GIO_ODD, to a fourth connection node CN04 in response to a second internal rising strobe signal RDSTRBP_R, a second read data driving unit 311_3 configured to output the read data transmitted through the other global input/output line GIO_ODD of the pair of global input/output lines GIO_EVEN and GIO_ODD, to the fourth connection node CN04 in response to a second internal falling strobe signal RDSTRBP_F, and a third read data driving unit 311_5 configured to transmit the read data outputted through the fourth connection node CN04, to the first through-chip via TSV01 in response to a read enable signal TSV_OE.

A second write data driving circuit 313 includes a first write data latch unit 313_1 configured to latch write data TDQ_WT transmitted from the first through-chip via TSV01, in response to a second rising alignment strobe signal DINSTRBP_QSR of second differential alignment strobe signals DINSTRBP_QSR and DINSTRBP_QSF, a first write data storage unit 313_3 configured to store the write data latched by the first write data latch unit 313_1, in response to the second rising alignment strobe signal DINSTRBP_QSR and output the stored write data in response to an internal write strobe signal WTSTRBP, a fourth write data driving unit 313_5 configured to output the write data stored in the first write data storage unit 313_3, to the corresponding global input/output line GIO_EVEN in response to an inverted read enable signal /TSV_OE, a second write data latch unit 313_7 configured to latch the write data TDQ_WT transmitted from the first through-chip via TSV01, in response to the second falling alignment strobe signal DINSTRBP_QSF of the second differential alignment strobe signals DINSTRBP_QSR and DINSTRBP_QSF, a second write data storage unit 313_9 configured to store the write data latched by the second write data latch unit 313_7, in response to the second falling alignment strobe signal DINSTRBP_QSF and output the stored write data in response to the internal write strobe signal WTSTRBP, and a fifth write data driving unit 313_11 configured to output the write data stored in the second write data storage unit 313_9, to the corresponding global input/output line GIO_ODD in response to the inverted read enable signal /TSV_OE. Here, the first and second write data latch unit 313_1 and 313_7 may be realized by the flip-flop circuit, and the first and second write data storage unit 313_3 and 313_9 may be realized by the first-in-first-out (FIFO) circuit.

The rising read strobe signal driving circuit 321 includes a first rising read strobe signal driving unit 321_1 configured to output the high voltage VDD to a fifth connection node CN05 in response to the second internal rising strobe signal RDSTRBP_R, a second rising read strobe signal driving unit 321_3 configured to output the low voltage VSS to the fifth connection node CN05 in response to the second internal falling strobe signal RDSTRBP_F, and a third rising read strobe signal driving unit 321_5 configured to transmit the rising read strobe signal outputted through the fifth connection node CN05, to the second through-chip via TSV02 in response to the read enable signal TSV_OE.

The falling read strobe signal driving circuit 323 includes a first falling read strobe signal driving unit 323_1 configured to output the low voltage VSS to a sixth connection node CN06 in response to the second internal rising strobe signal RDSTRBP_R, a second falling read strobe signal driving unit 323_3 configured to output the high voltage VDD to the sixth connection node CN06 in response to the second internal falling strobe signal RDSTRBP_F, and a third falling read strobe signal driving unit 323_5 configured to transmit the falling read strobe signal outputted through the sixth connection node CN06, to the third through-chip via TSV03 in response to the read enable signal TSV_OE.

The second rising alignment strobe signal driving circuit 325 includes a third input unit 325_1 configured to receive a rising write strobe signal TDQSR_WT transmitted through the second through-chip via TSV02, in response to the inverted read enable signal /TSV_OE, a third delay unit 325_3 configured to delay the rising write strobe signal outputted from the third input unit 325_1, by the given delay time and output a resulting signal, and a third repeater 325_5 configured to output the output signal of the third delay unit 325_3 as the second rising alignment strobe signal DINSTRBP_QSR with the given driving force.

The second falling alignment strobe signal driving circuit 327 includes a fourth input unit 327_1 configured to receive a falling write strobe signal TDQSF_WT transmitted through the third through-chip via TSV03, in response to the inverted read enable signal /TSV_OE, a fourth delay unit 327_3 configured to delay the falling write strobe signal outputted from the third input unit 327_1, by the given delay time and output a resulting signal, and a fourth repeater 327_5 configured to output the output signal of the fourth delay unit 327_3 as the second falling alignment strobe signal DINSTRBP_QSF with the given driving force. Here, the third and fourth input unit 325_1 and 327_1 may be realized by the AND logic, and the third and fourth delay unit 325_3 and 327_3 may be realized by the variable delay line (VDL).

Figure 5:
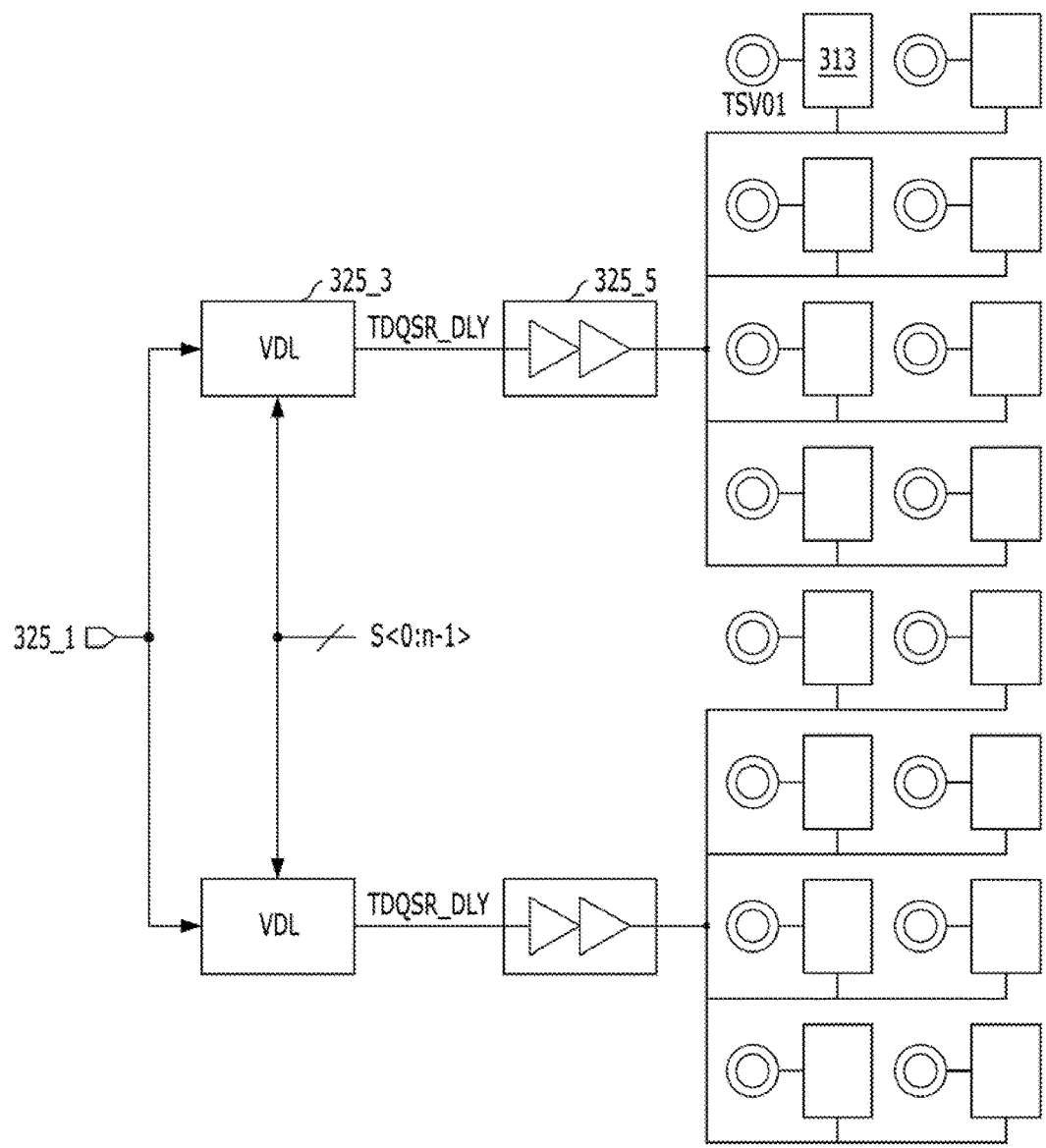
FIG. 5 is a block configuration diagram illustrating delay units and repeaters of the slave chip shown in FIG. 4.

FIG. 5 is a detailed diagram illustrating the first to fourth delay units 255_3, 257_3, 325_3 and 327_3 and the first to fourth repeaters 255_5, 257_5, 325_5 and 327_5 shown in FIG. 4.

In the embodiment of the present invention, for the sake of convenience in explanation, the third delay unit 325_3 and the third repeater 325_5 included in the slave chip 300 will be representatively described.

Referring to FIG. 5, the third delay unit 325_3 delays the rising write strobe signal TDQSR_WT inputted through the third input unit 325_1 by the given delay time, and outputs the resulting signal to the third repeater 325_5. For example, the third delay unit 325_3 may be realized by the variable delay line (VDL) of which delay time is controlled in response to delay control signals S<0:n−1>. The delay time corresponds to a setup time for securing a setup/hold time margin when the first write data latch unit 313_1 or the first write data storage unit 313_3 latches or stores the write data TDQ_WT. For example, the delay time may correspond to ¼ cycle of the rising write strobe signal TDQSR_WT.

The third repeater 325_5 to output a delayed rising write strobe signal TDQSR_DLY delayed through the third delay unit 325_3, with the given driving force, is means for compensating the driving force of the delayed rising write strobe signal TDQSR_DLY in the case where the delayed rising write strobe signal TDQSR_DLY should be routed in parallel. Although only one second write data driving circuit 313 corresponding to one first through-chip via TSV01 is shown in FIG. 4 for the sake of convenience in explanation, it is necessary to transmit the delayed rising write strobe signal TDQSR_DLY delayed through the third delay unit 325_3, with a large driving force, when a plurality of second write data driving circuits 313 are provided in correspondence to a plurality of through-chip vias as shown in FIG. 5.

Hereafter, operations of the semiconductor integrated circuit in accordance with the embodiment of the present invention, configured as mentioned above, will be described with reference to FIGS. 6 to 8.

In the embodiment of the present invention, for the sake of convenience in explanation, a procedure in which data is inputted and outputted through one data pad will be described.

Figure 6:
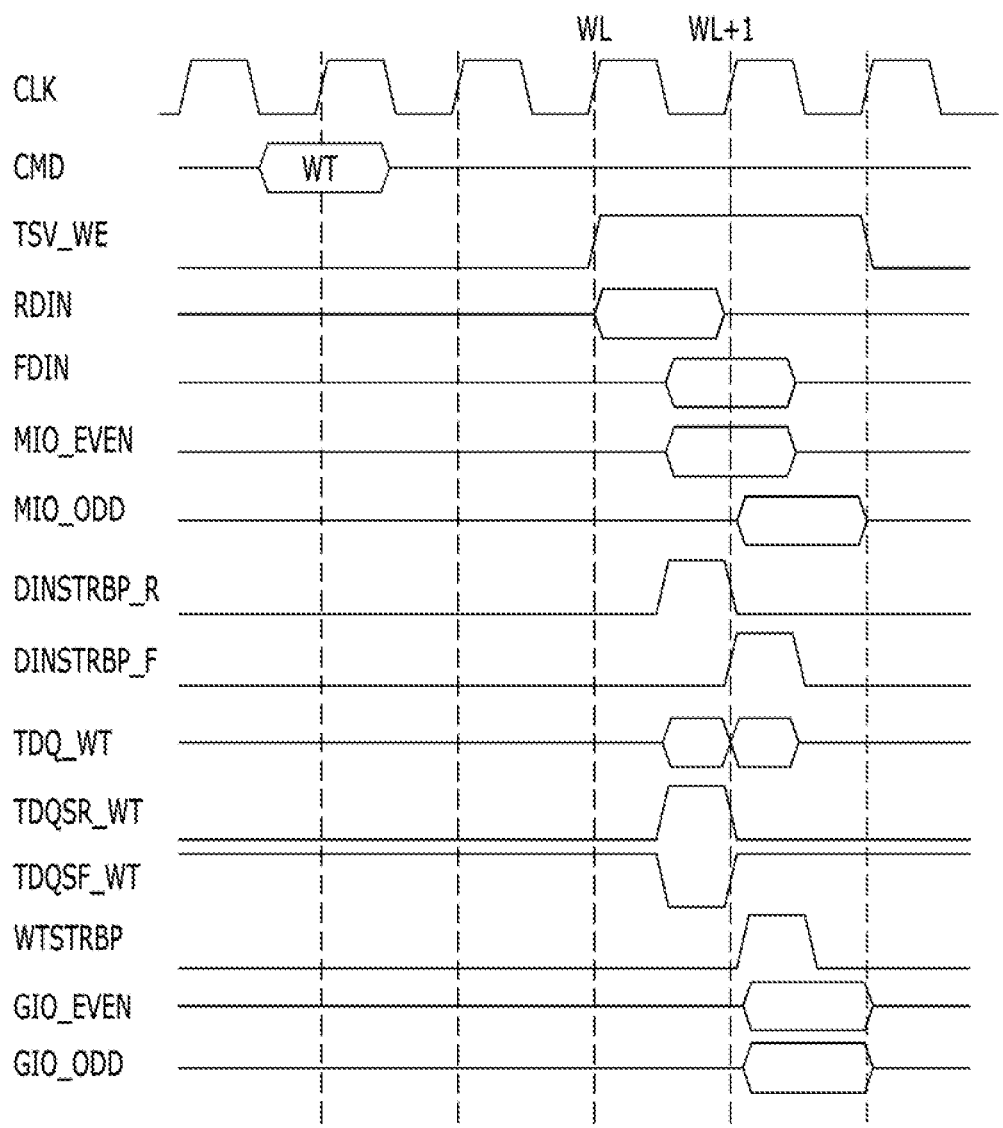
FIG. 6 is a timing diagram for illustrating a write operation among operations of the semiconductor integrated circuit in accordance with the embodiment of the present invention.
Figure 7:
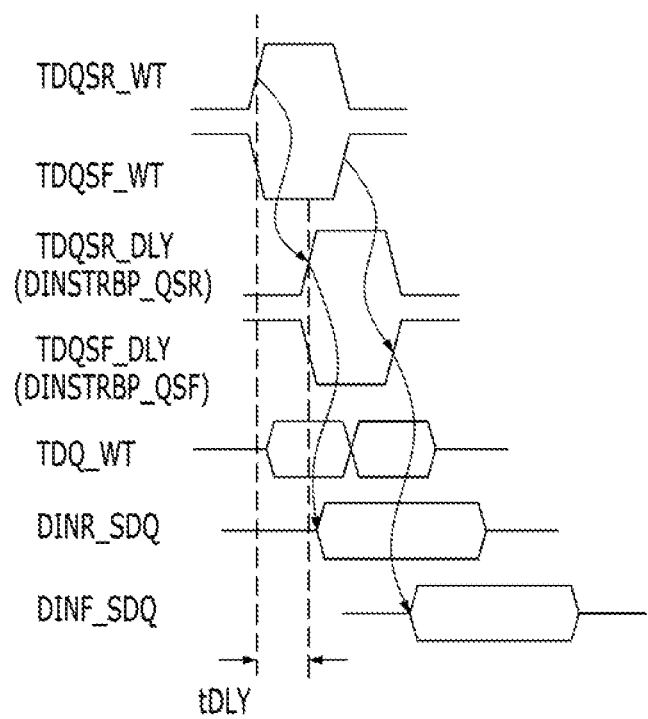
FIG. 7 is a timing diagram for illustrating a procedure in which the setup time of data is secured in the write operation explained in FIG. 6.
Figure 8:
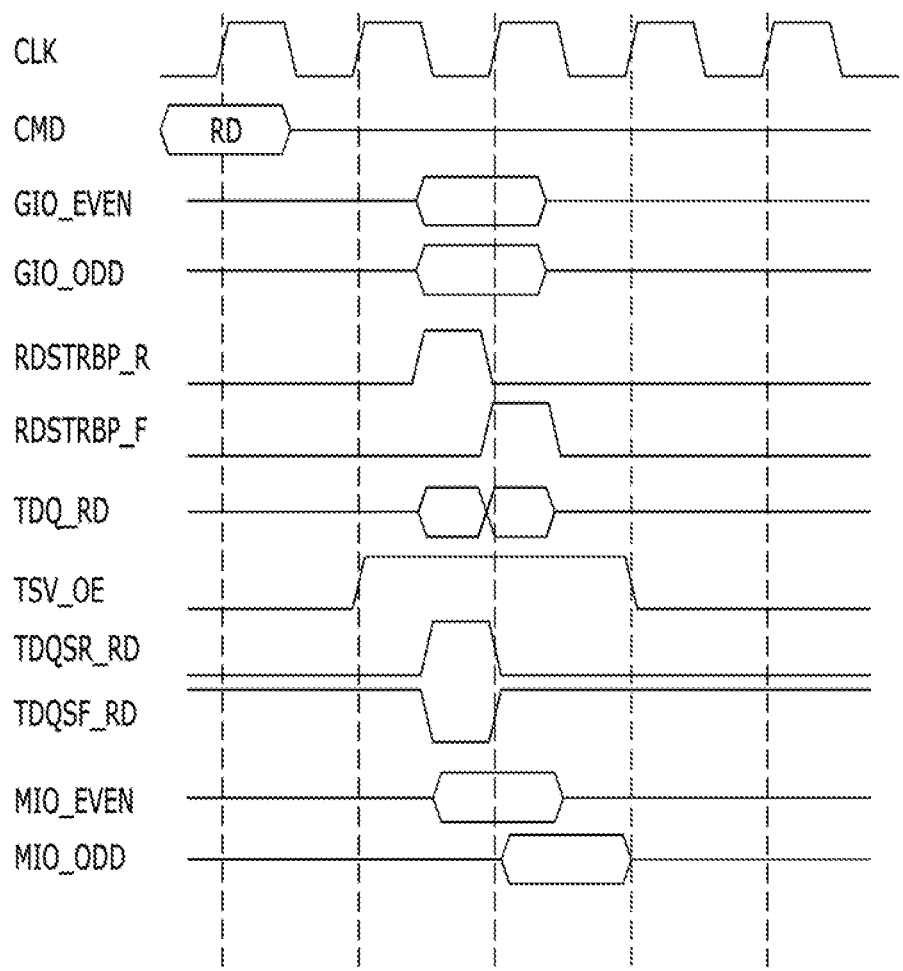
FIG. 8 is a timing diagram for illustrating a read operation among the operations of the semiconductor integrated circuit in accordance with the embodiment of the present invention.

FIG. 6 is a timing diagram for illustrating a write operation among operations of the semiconductor integrated circuit in accordance with the embodiment of the present invention. FIG. 7 is a timing diagram for illustrating a procedure in which the setup/hold time margin of data is secured in the write operation explained in FIG. 6. FIG. 8 is a timing diagram for illustrating a read operation among the operations of the semiconductor integrated circuit in accordance with the embodiment of the present invention.

First, the write operation of the semiconductor integrated circuit in accordance with the embodiment of the present invention will be described.

Referring to FIG. 6, when a write command WT and write data are applied to the master chip 200 from the external controller, the write enable signal TSV_WE is activated to a logic high level after a write latency WL from the application time of the write command WT, and the write data RDIN and FDIN are outputted in parallel through the parallel conversion unit 221 from a time after the write latency WL. The write data RDIN and FDIN are loaded on the pair of middle input/output lines MIO_EVEN and MIO_ODD after ½ cycle (0.5 tck) of an external clock CLK.

The first write data driving circuit 241 transmits the write data transmitted in parallel through the pair of middle input/output lines MIO_EVEN and MIO_ODD, to the first through-chip via TSV01 in the DDR scheme in response to the first internal rising strobe signal DINSTRBP_R and the first internal falling strobe signal DINSTRBP_F.

The differential write strobe signal driving circuits 251 and 253 generate the differential write strobe signals TDQSR_WT and TDQSF_WT source-synchronized with the write data TDQ_WT, in response to the first internal rising strobe signal DINSTRBP_R and the first internal falling strobe signal DINSTRBP_F, and transmit them to the second and third through-chip vias TSV02 and TSV03.

In succession, as the write data TDQ_WT is transmitted to the slave chip 300 through the first through-chip via TSV01 and, together with this, the differential write strobe signals TDQSR_WT and TDQSF_WT are transmitted to the slave chip 300 through the second and third through-chip vias TSV02 and TSV03. The second differential alignment strobe signal driving circuits 325 and 327 delay the differential write strobe signals TDQSR_WT and TDQSF_WT by the given delay time and generate the second differential alignment strobe signals DINSTRBP_QSR and DINSTRBP_QSF driven with the given driving force. The second write data driving circuit 313 latches and stores the write data TDQ_WT in parallel in response to the second differential alignment strobe signals DINSTRBP_QSR and DINSTRBP_QSF and outputs the stored data simultaneously to the pair of global input/output lines GIO_EVEN and GIO_ODD in response to the internal write strobe signal WTSTRBP.

The reason why the differential write strobe signals TDQSR_WT and TDQSF_WT are delayed by the given delay time is to sufficiently secure the setup/hold time margin of the write data TDQ_WT, which will be described below with reference to FIG. 7. Referring to FIG. 7, the differential write strobe signals TDQSR_WT and TDQSF_WT are delayed by a given delay time tDLY through the third and fourth delay units 325_3 and 327_3. The given delay time tDLY corresponds to ¼ cycle of the differential write strobe signals TDQSR_WT and TDQSF_WT and corresponds to a setup time (tSETUP) of the write data TDQ_WT (tDLY=tSETUP). In this way, as the setup/hold time margin of the write data TDQ_WT is sufficiently secured, the write data TDQ_WT may be precisely latched at the rising edges of the differential write strobe signals TDQSR_WT and TDQSF_WT. For reference, the reference symbol DINR_SDQ designates the output signal of the first write data latch unit 313_1, and the reference symbol DINF_SDQ designates the output signal of the second write data latch unit 313_7.

While not shown in detail, in the case where the plurality of second write data driving circuits 313 are provided in correspondence to the plurality of first through-chip vias TSV01 (see FIG. 5), delayed differential write strobe signals TDQSR_DLY and TDQSF_DLY are generated as the second differential alignment strobe signals DINSTRBP_QSR and DINSTRBP_QSF with the large driving force through the third and fourth repeaters 325_5 and 327_5, and the second differential alignment strobe signals DINSTRBP_QSR and DINSTRBP_QSF are routed in parallel to the plurality of second write data driving circuits 313.

Next, the read operation of the semiconductor integrated circuit in accordance with the embodiment of the present invention will be described.

Referring to FIG. 8, when a read command RD is applied to the master chip 200 from the external controller, the slave chip 300 provides corresponding read data under the control of the master chip 200. Operations of the slave chip 300 will be described below in detail. As the read data are loaded on the pair of global input/output lines GIO_EVEN and GIO_ODD, the second read data driving circuit 311 transmits the read data transmitted in parallel through the pair of global input/output lines GIO_EVEN and GIO_ODD, to the first through-chip via TSV01 in the DDR scheme in response to the second internal strobe signals RDSTRBP_R and RDSTRBP_F.

The differential read strobe signal driving circuits 321 and 323 generate the differential read strobe signals TDQSR_RD and TDQSF_RD source-synchronized with the read data TDQ_RD, in response to the second internal strobe signals RDSTRBP_R and RDSTRBP_F and transmit them to the second and third through-chip vias TSV02 and TSV03.

In succession, as the read data TDQ_RD is transmitted to the master chip 200 through the first through-chip via TSV01 and, together with this, the differential read strobe signals TDQSR_RD and TDQSF_RD are transmitted to the master chip 200 through the second and third through-chip vias TSV02 and TSV03. The first differential alignment strobe signal driving circuits 255 and 257 delay the differential read strobe signals TDQSR_RD and TDQSF_RD by the given delay time and generate the first differential alignment strobe signals RDSTRBP_QSR and RDSTRBP_QSF. The first read data driving circuit 243 latches and stores the read data TDQ_RD in parallel in response to the first differential alignment strobe signals RDSTRBP_QSR and RDSTRBP_QSF and outputs the stored data to the pair of middle input/output lines MIO_EVEN and MIO_ODD in response to the internal read strobe signal POUTSTRBP.

The reason why the differential read strobe signals TDQSR_RD and TDQSF_RD are delayed by the given delay time is to sufficiently secure the setup/hold time margin of the read data TDQ_RD. Since this was described above (see FIG. 7), detailed description thereof will be omitted herein.

While not shown in detail, in the case where the plurality of first read data driving circuits 243 are provided in correspondence to the plurality of first through-chip vias TSV01 (see FIG. 5), delayed differential read strobe signals TDQSR_DLY and TDQSF_DLY are generated as the first differential alignment strobe signals RDSTRBP_QSR and RDSTRBP_QSF with the large driving force through the first and second repeaters 255_5 and 257_5, and the first differential alignment strobe signals RDSTRBP_QSR and RDSTRBP_QSF are routed in parallel to the plurality of first read data driving circuits 243.

As is apparent from the above descriptions, according to the embodiment of the present invention, advantages are provided in that, since a DDR (double data rate) scheme is used when data is interfaced between semiconductor chips, bandwidth may be improved. Also, as the bandwidth is improved, the number of through-chip vias may decrease and space needed may decrease. Furthermore, since a strobe signal source-synchronized with data is also transmitted when the data is interfaced between semiconductor chips, the reliability of the data may be enhanced. In particular, when receiving the strobe signal source-synchronized with the data, because the setup/hold time of the data is sufficiently secured internally, interface performance between chips may improve.

While the present invention has been described with respect to the specific embodiments, it will be apparent to those skilled in the art that various changes and modifications may be made without departing from the spirit and scope of the invention as defined in the following claims.

What is claimed is:

1. A semiconductor integrated circuit including at least one master chip and at least one slave chip that are stacked,
   the master chip being configured to transmit write data and differential write strobe signals source-synchronized with the write data, to the slave chip based on a first internal rising strobe signal and a first internal falling strobe signal, and receive and output read data transmitted from the slave chip, based on first differential alignment strobe signals which are provided from the slave chip and are generated by delaying differential read strobe signals source-synchronized with the read data, by a given delay time, and
   the slave chip being configured to transmit the read data and the differential read strobe signals, to the master chip in based on a second internal rising strobe signal and a second internal falling strobe signal, and store therein the write data transmitted from the master chip, based on second differential alignment strobe signals which are generated by delaying the differential write strobe signals by the given delay time.

2. The semiconductor integrated circuit of claim 1, wherein the master chip receives the read data in synchronization with given edges of the first differential strobe signals, and wherein the slave chip receives the write data in synchronization with given edges of the second differential strobe signals.

3. The semiconductor integrated circuit of claim 1, wherein the master chip comprises:
   at least one first write data driving circuit configured to transmit the respective write data transmitted through at least one pair of middle input/output lines, to the slave chip in a DDR scheme based on the first internal rising strobe signal, the first internal falling strobe signal, and a write enable signal;
   a write strobe signal driving circuit configured to generate the write strobe signals based on the first internal strobe signal and the write enable signal, and transmit the write strobe signals to the slave chip;
   a first read data driving circuit configured to load the respective read data transmitted in the DDR scheme from the slave chip, on the pair of middle input/output lines based on the first alignment strobe signals and an inverted write enable signal; and
   a first differential alignment strobe signal driving circuit configured to generate the first differential alignment strobe signals by delaying the differential read strobe signals transmitted from the slave chip by the given delay time based on the inverted write enable signal and a first delay control signal.

4. The semiconductor integrated circuit of claim 3, wherein the first differential alignment strobe signal driving circuit comprises:
- a first rising alignment strobe signal driving circuit configured to output a first rising alignment strobe signal corresponding to a rising read strobe signal of the differential read strobe signals, based on the inverted write enable signal and the first delay control signal; and
- a first falling alignment strobe signal driving circuit configured to output a first falling alignment strobe signal corresponding to a falling read strobe signal of the differential read strobe signals, based on the inverted write enable signal and the first delay control signal.

5. The semiconductor integrated circuit of claim 4, wherein the first rising alignment strobe signal driving circuit comprises:
- a first input unit configured to receive the rising read strobe signal based on the inverted write enable signal; and
- a first delay unit configured to delay the rising read strobe signal outputted from the first input unit, by the given delay time based on the first delay control signal, and output the first rising alignment strobe signal.

6. The semiconductor integrated circuit of claim 5, wherein the first rising alignment strobe signal driving circuit further comprises:
- a first repeater configured to output the first rising alignment strobe signal with a given driving force.

7. The semiconductor integrated circuit of claim 4, wherein the first falling alignment strobe signal driving circuit comprises:
- a second input unit configured to receive the falling read strobe signal based on the inverted write enable signal; and
- a second delay unit configured to delay the falling read strobe signal outputted from the second input unit, by the given delay time based on the first delay control signal, and output the first falling alignment strobe signal.

8. The semiconductor integrated circuit of claim 7, wherein the first falling alignment strobe signal driving circuit further comprises:
- a second repeater configured to output the first falling alignment strobe signal with the given driving force.

9. The semiconductor integrated circuit of claim 1, wherein the given delay time corresponds to ¼ cycle of the differential read strobe signals or the differential write strobe signals.

10. The semiconductor integrated circuit of claim 1, wherein the slave chip comprises:
- at least one second read data driving circuit configured to transmit the respective read data transmitted through at least one pair of global input/output lines, to the master chip in the DDR scheme based on the second internal rising strobe signal, the second internal falling strobe signal, and a read enable signal;
- a read strobe signal driving circuit configured to generate the differential read strobe signals based on the second internal rising strobe signal, the second internal falling strobe signal, and the read enable signal, and transmit the differential read strobe signals to the master chip;
- a second write data driving circuit configured to load the respective write data transmitted from the master chip, on the pair of global input/output lines based on the second differential alignment strobe signals, an internal write strobe signal and an inverted read enable signal; and
- a second differential alignment strobe signal driving circuit configured to generate the second differential alignment strobe signals corresponding to the differential write strobe signals, based on the inverted read enable signal and a second delay control signal.

11. The semiconductor integrated circuit of claim 10, wherein the second differential alignment strobe signal driving circuit comprises:
- a second rising alignment strobe signal driving circuit configured to output a second rising alignment strobe signal corresponding to a rising write strobe signal of the differential write strobe signals, based on the inverted read enable signal and the second delay control signal; and
- a second falling alignment strobe signal driving circuit configured to output a second falling alignment strobe signal corresponding to a falling write strobe signal of the differential write strobe signals, based on the inverted read enable signal and the second delay control signal.

12. The semiconductor integrated circuit of claim 11, wherein the second rising alignment strobe signal driving circuit comprises:
- a third input unit configured to receive the rising write strobe signal based on the inverted read enable signal; and
- a third delay unit configured to delay the rising write strobe signal outputted from the third input unit, by the given delay time based on the second delay control signal, and output the second rising alignment strobe signal.

13. The semiconductor integrated circuit of claim 12, wherein the second rising alignment strobe signal driving circuit further comprises:
- a third repeater configured to output the second rising alignment strobe signal with the given driving force.

14. The semiconductor integrated circuit of claim 11, wherein the second falling alignment strobe signal driving circuit comprises:
- a fourth input unit configured to receive the falling write strobe signal based on the inverted read enable signal; and
- a fourth delay unit configured to delay the falling write strobe signal outputted from the fourth input unit, by the given delay time based on the second delay control signal, and output the second falling alignment strobe signal.

15. The semiconductor integrated circuit of claim 14, wherein the second falling alignment strobe signal driving circuit further comprises:
- a fourth repeater configured to output the second falling alignment strobe signal with the given driving force.

16. The semiconductor integrated circuit of claim 1, wherein the given delay time corresponds to ¼ cycle of the differential write strobe signals or the differential read strobe signals.

17. The semiconductor integrated circuit of claim 1, wherein the write data and the read data are transmitted through at least one first through-chip via that vertically passes through the master chip or the slave chip, and wherein the differential write strobe signals and the differential read strobe signals are transmitted through second and third through-chip vias that vertically pass through the master chip or the slave chip.

* * * * *